United States Patent
Buchanan

(10) Patent No.: US 10,242,736 B2
(45) Date of Patent: Mar. 26, 2019

(54) REFERENCE CURRENTS FOR INPUT CURRENT COMPARISONS

(71) Applicant: Hewlett Packard Enterprise Development LP, Houston, TX (US)

(72) Inventor: Brent Buchanan, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 120 days.

(21) Appl. No.: 15/318,718

(22) PCT Filed: Jul. 29, 2014

(86) PCT No.: PCT/US2014/048580
§ 371 (c)(1),
(2) Date: Dec. 14, 2016

(87) PCT Pub. No.: WO2016/018247
PCT Pub. Date: Feb. 4, 2016

(65) Prior Publication Data
US 2018/0166133 A1    Jun. 14, 2018

(51) Int. Cl.
| G11C 16/06 | (2006.01) |
| G11C 13/00 | (2006.01) |
| G11C 7/06  | (2006.01) |
| G11C 11/56 | (2006.01) |
| G11C 7/14  | (2006.01) |

(52) U.S. Cl.
CPC ............ *G11C 13/004* (2013.01); *G11C 7/062* (2013.01); *G11C 7/067* (2013.01); *G11C 11/5678* (2013.01); *G11C 13/0004* (2013.01); *G11C 7/14* (2013.01); *G11C 2207/063* (2013.01)

(58) Field of Classification Search
CPC .............. G11C 13/004; G11C 11/5678; G11C 13/0004
See application file for complete search history.

(56) References Cited

U.S. PATENT DOCUMENTS

| 6,330,627 | B1 * | 12/2001 | Toda ................... G06F 13/4243 327/149 |
| 8,064,248 | B2   | 11/2011 | Lung |
| 8,315,089 | B2   | 11/2012 | Kang et al. |
| 8,369,179 | B2 * | 2/2013  | Kim ........................ H03K 3/02 365/230.03 |
| 8,462,536 | B2 * | 6/2013  | Nobunaga .............. G11C 16/10 365/230.03 |

(Continued)

OTHER PUBLICATIONS

International Searching Authority, The International Search Report and the Written Opinion, PCT/US2014/048580, dated Feb. 26, 2015, 11 Pages.

(Continued)

*Primary Examiner* — Pho M Luu
(74) *Attorney, Agent, or Firm* — Hewlett Packard Enterprise Patent Department

(57) ABSTRACT

An example device includes a first module, a second module, and a third module. The first module is to compare an input current to a first reference current, and provide a first output. The second module is to compare the input current to a second reference current, and provide a second output. The third module is to compare the first output to the second output, and provide a third output indicative of a state associated with the input current.

16 Claims, 8 Drawing Sheets

(56) References Cited

U.S. PATENT DOCUMENTS

| | | |
|---|---|---|
| 8,509,003 B2 | 8/2013 | Lin et al. |
| 2002/0057597 A1 | 5/2002 | Fuchigami et al. |
| 2003/0123294 A1 | 7/2003 | Kim et al. |
| 2004/0228179 A1 | 11/2004 | Pagliato et al. |
| 2005/0276138 A1 | 12/2005 | Inoue |
| 2008/0019192 A1 | 1/2008 | Wang et al. |
| 2013/0336051 A1 | 12/2013 | Jurasek et al. |
| 2014/0003124 A1 | 1/2014 | Youn et al. |
| 2017/0133088 A1* | 5/2017 | Buchanan .............. G11C 16/10 |

OTHER PUBLICATIONS

Xu, C., et al., Design Implications of Memristor-Based RRAM Cross-Point Structures, May 22, 2011, EDAA, pp. 734-739.

* cited by examiner

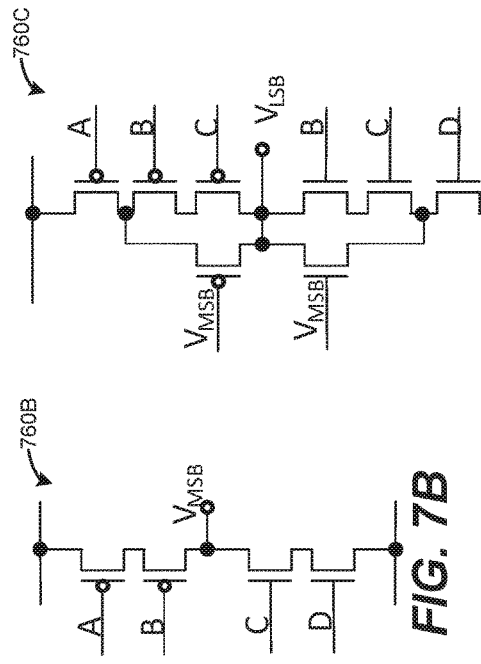
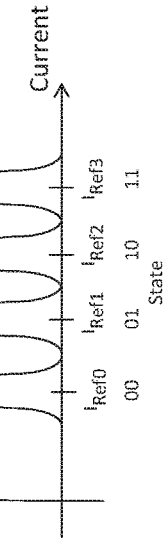
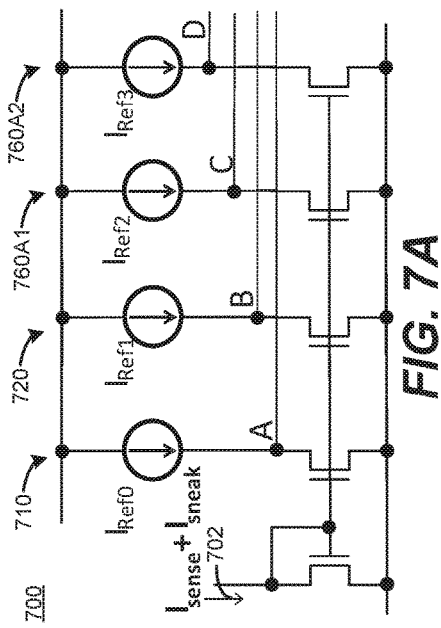
FIG. 7A
FIG. 7B
FIG. 7C
FIG. 7D
FIG. 7E

REFERENCE CURRENTS FOR INPUT CURRENT COMPARISONS

BACKGROUND

Memory cells may be used to store data. One scheme for sensing a value (state) of a resistive-state memory cell, is through the use of a current-mode sense amp. A voltage may be applied across the cell whose state is to be determined, and the resulting current may be compared against a reference current.

BRIEF DESCRIPTION OF THE DRAWINGS/FIGURES

FIGS. 7A-7C are a circuit diagram of a device including modules according to an example.

FIG. 7D is a state table corresponding to states of the device of FIGS. 7A-7C according to an example.

FIG. 7E is a diagram of current probabilities for the device of FIGS. 7A-7C according to an example.

DETAILED DESCRIPTION

Example devices (e.g., sense amps) and methods provided herein enable determination, with a relatively large read margin, of a state of a memory cell. Multiple tests/comparisons against the memory cell's sampled input current may be performed, and the tests may be performed in parallel. An input current can be compared against a plurality of reference currents. A reference current may correspond to and/or overlap with a current value corresponding to a cell state, in contrast to being limited to one reference current that is confined between the different input current values corresponding to cell states.

Thus, examples provided herein may operate with single-state, dual-state, and/or multi-state memory cells (i.e., N-state memory), compatible with various types of memories, such as resistive random access memory (RRAM), phase-change (PC) RAM, magnetic (M) RAM, and other technologies (e.g., those that are read resistively or otherwise based on currents). Various benefits are enabled, such as an ability for devices based on the principles herein to act in real time, quickly with no phasing, no need for switching intelligence, and with insensitivity to variations in reference current and sense/sneak current, e.g., based on the relatively large read margins.

Figure 1:
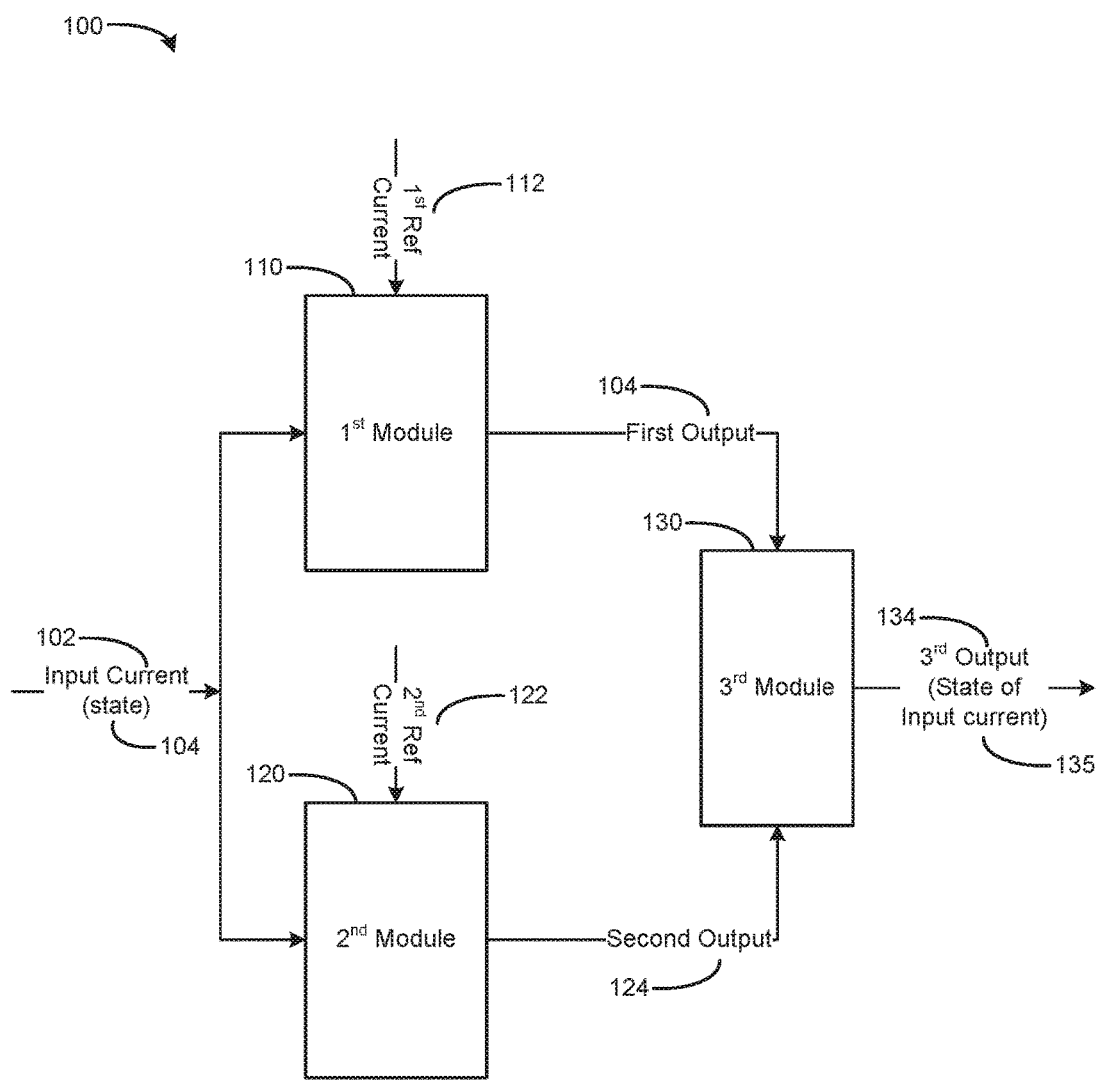
FIG. 1 is a block diagram of a device including modules according to an example.

FIG. 1 is a block diagram of a device 100 including modules 110, 120, and 130 according to an example. An input current 102, associated with a state 104 of a device (not shown in FIG. 1), is received at first module 110 and second module 120. The first module 110 is to compare the input current 102 to the first reference current 112, and provide first output 104 indicating a result of the first comparison. The second module 120 is to compare the input current 102 to the second reference current 122, and provide second output 124 indicating a result of the second comparison. The third module 130 is to compare the first output 104 to the second output 124, and provide third output 134 indicative of a state of the input current 135, based on the third comparison.

The example device 100 illustrates a dual comparison sense amp, which is to perform at least two comparisons against the input current 102 to identify two states of a memory element providing the input current 102 to the device 100. In an alternate example, the device 100 may be extended arbitrarily, to include N modules to perform N comparisons to identify N states of a memory element (N may be at least 1). Accordingly, examples provided herein are not to be limited to dual-state devices as specifically illustrated in FIG. 1. The comparisons performed by the modules may occur in parallel. Thus, device 100 may sense the value of a resistive-state memory cell (e.g., written or not written) based on a current-mode sense amp(s). The first and second modules 110, 120 use first and second reference currents 112, 122, respectively. The reference currents are to correspond to the input currents 102 that would be provided by a memory cell in its various storage states. For example, a reference current may be substantially centered on a state current, with a distribution of the reference current overlapping a distribution of the state current. Thus, the reference current does not need to independently consume separation space (i.e., read margin) between one state current and another, enabling the device 100 to more accurately and precisely determine a state of the memory cell. The third module 130 may determine which of the first output 104 and the second output 124 is stronger. For example, if the input current 102 is closer to the first reference current 112, the first output 104 will be a weak signal and the second output 124 will be a strong signal. In contrast, if the input current 102 is closer to the second reference current 122, the second output 124 will be a weak signal, and the first output 104 will be a strong signal. The third module 130 will evaluate the first output 104 and second output 124 accordingly, and provide third output 134 that is indicative of the state 135 of a device associated with providing the input current 102 to be evaluated.

The block diagram representations shown in FIG. 1 are to illustrate that various alternative techniques may be used to provide such functionality represented by the first, second, and third modules. Accordingly, such modules are not meant to be limited to the specific circuit examples provided in the following figures.

Figure 2A:
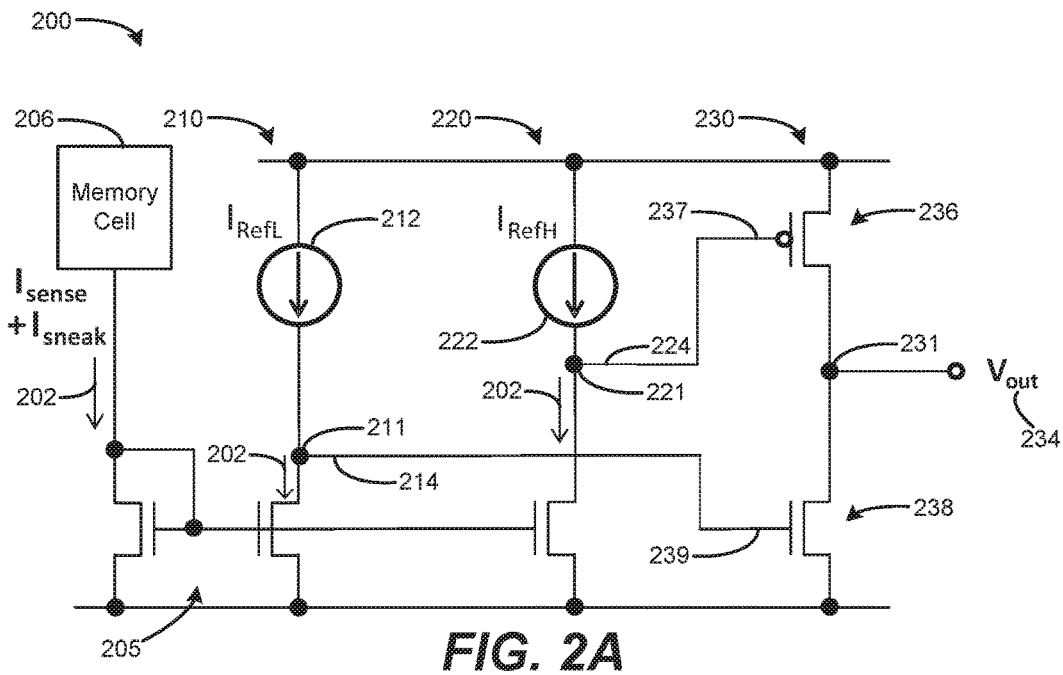
FIG. 2A is a circuit diagram of a device including modules according to an example.

FIG. 2A is a circuit diagram of a device 200 including modules 210, 220, 230 according to an example. The first module 210 and second module 220 are to receive input current 202, via current mirror 205, from the memory cell 206 whose state is to be determined. The input current 202 may include, e.g., a sense current and a sneak current. The first module 210 includes first node 211 and first reference current 212, which is compared to the input current 202. The first module 210 is to provide first output 214 to the third module 230 (received as a second input 239 of the second switch element 238 of the third module 230). The second module 220 includes second node 221 and second reference current 222, which is compared to the input current 202. The second module 220 is to provide second output 224 to the third module 230 (received as a first input 237 of the first switch element 236 of the third module 230). The third module 230 includes third node 231, and compares the outputs 214, 224 (received as inputs 237, 239) to provide third output 234.

The memory cell 206 may be a memristor or other element, such as an individual memory bit cell that has been selected in a crosspoint. The memory cell 206 may change its resistive state, depending on how it has been programmed. In a dual-state example, if the memory cell 206 has been set with a digital "1," by applying a positive voltage across it, memory cell 206 will provide a low resistive state. If the memory cell 206 is reset to "0," by applying a voltage having a reversed polarity compared to the set voltage, the memory cell 206 will be pushed into a high resistive state. Device 200 can sense the input current 202, from the memory cell 206, to determine whether it is in the high resistive state or the low resistive state. A crosspoint may include many memory cells 206, arranged in rows and columns. However, applying a voltage between the select row and the select column for a cell 206 of the crosspoint to be selected, some of the applied voltage also may appear across other cells in that crosspoint, which may lead to sneak current. Sneak currents can consume a portion of the read margins for the memory cells, further shrinking available read margin and causing challenges when reading cell states constrained by a small read margin. Thus, the input current 202 is illustrated as having a sense current portion, and a sneak current portion.

The input current 202 is provided to the first module 210, and applied to the first node 211, e.g., based on current mirror 205 (the input current 202 similarly is mirrored to the second node 221). Between the input current 202 and the first reference current 212, the stronger current source pulls the first output 214 of the first node 211 to where the voltage causes it to scale back its current output to match that of the weaker current source. If the input current 202 is greater than the first reference current 212, the first output 214 is pulled low by the input current 202. If the input current 202 is less than the first reference current 212, the first output 214 is pulled high by the first reference current 212. The first reference current 212 corresponds to a low resistive state of the memory cell 206. A similar comparison is carried out in the second module 220.

Thus, two current comparisons are carried out by first and second modules 210, 220 of the device 200. Node 211 either goes strongly high, or is weakly driven, and does not go strongly low, based on a comparison between the input current 202 and the first reference current 212. Node 221 either goes strongly low, or is weakly driven, and does not go strongly high, based on a comparison between the input current 202 and the second reference current 222. A node may provide an analog output signal (first and second output signals 214, 224) that is proportional to a distance between the sensed input current and the corresponding first or second reference current. Because of the relatively large spacing between currents, there is a good distance between the reference currents, enabling a good signal between the first and second nodes 211, 221.

At the third module 230, the two analog first and second output signals 214, 224 are compared, to provide Vout 234 at the third node 231. The input current 202 is likely to have a value somewhere between the high resistive state and the low resistive state. Accordingly, one of the two comparisons of the first and second modules 210, 220 is likely to be active, and the other comparison is likely to provide a weakly driven or undriven signal. Thus, in the third module 230, the first switch element 236 (shown for example as a positive field effect transistor (PFET) receiving first input 237) or the second switch element 238 (shown for example as a negative field effect transistor (NFET) receiving second input 239) will turn on, causing Vout to behave as a clean digital signal.

Figure 2B:
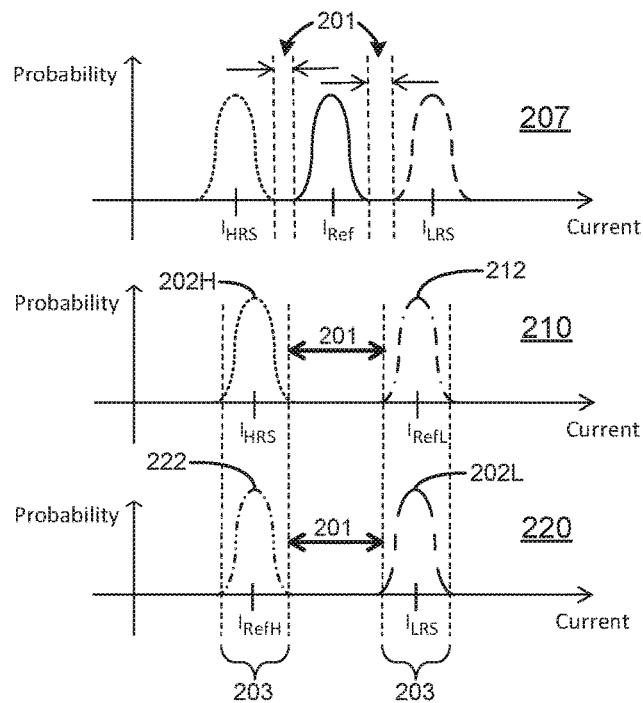
FIG. 2B is a diagram of current probabilities for modules according to an example.

FIG. 2B is a diagram of current probabilities for a sample module 207, and first/second modules 210, 220, according to an example. The diagrams illustrate probability distributions of possible currents (reference currents and high/low resistive state currents). Thus, a current has a set of probability distributions that are represented in the diagram as Gaussian curves. An actual current as measured, for a given element at a given time, will manifest as a single spike in the illustrated diagram, whose horizontal location corresponds to its magnitude. The spike for a current has a probability of being located somewhere within the illustrated Gaussian distribution, according to a vertical height of the curve for that current. Such probability distributions exist for reference currents and those currents from reading a cell (and other currents), whose likelihood of distribution is portrayed by amplitude in the diagrams. Such current distributions result in a reduction of the read margin 201, which is shown as being crowded by the width of the curves representing the current distributions. Sneak current can further exacerbate the crowding of the read margin 201, e.g., by causing the curves to be translated horizontally.

A wide/high read margin distance (corresponding to a signal-to-noise ratio) enables faster performance of comparison operations. A larger read margin is associated with a relaxation in circuit area, power, complexity, and/or other resources needed to successfully determine a state of the memory cell 206 within that read margin.

The sample module 207 (whose current behavior is shown for illustration/comparison, and whose circuit diagram is not shown) represents a scenario where the reference current $I_{REF}$ is positioned between the high and low currents corresponding to the high resistance state ($I_{HRS}$) and the low resistance state ($I_{LRS}$) of a device, such as a binary resistive-state memory cell. A binary/two-state cell may use one bit to represent a 'low' state and a 'high' state. The sample module 207 has centered the single reference current between the two states that are intended to be resolved, causing the width of the reference current's distribution to consume a portion of the spacing between the state levels. Furthermore, either one of the resulting comparison signals (the result of comparing the reference current against the sample current) is less than half of the separation between the two states. In an extreme case, where the state being sampled is at the inside extreme of its distribution and the reference value in use is at the closer extreme of its distribution, the signal developed from comparing these two signals can be quite small, easily swamped by aggressors (e.g., power supply noise), and consequently difficult to resolve (requiring circuit complexity, power, or time to be traded for the low read margin 201 (e.g., signal-to-noise ratio (SNR)). The high and low currents of the high and low states are sandwiching the reference current, resulting in small read margins 201 between different signals. For sensing to be reliable, the states and reference values should be far enough apart to clearly distinguish where the sample current falls with regard to the reference current (above or below) for all possible values of currents, voltages, and circuit element sizes within each of their respective statistical distributions. The sample module 207 thereby consumes read margin with the width of the reference current's statistical distribution, and splits the remaining space between states to form the minimal working read margin 201. Accordingly, the sample module 207 would be limited by requiring relatively more resources and/or complex circuitry in order to attempt to successfully operate in view of the small read margins 201.

In contrast to the sample module 207, the current probabilities shown for first module 210 and second module 220 enable much wider read margins 201. The sampled input current (shown as high resistive state 202H and low resistive state 202L) is compared to two different reference currents 212, 222, based on two comparisons. Instead of a single reference current positioned between the two state currents, the first module 210 moves the first reference current 212 to the right (corresponding to a location of the low resistive state input current 202L), and the second module 220 moves the second reference current 222 to the left (corresponding to a location of the high resistive state input current 202H).

Accordingly, the reference currents 212, 222 and their distributions do not consume the read margins 201. The first module 210 provides a wide read margin 201 between the first reference current 212 and the input current 202H (corresponding to a current 202 from the memory cell 206 in a high resistance state). The second module 220 provides a wide read margin 201 between the second reference current 222 and the input current 202L (corresponding to a current 202 from the memory cell 206 in a low resistance state). The reference currents 212, 222 are chosen to have an overlap 203 with input currents 202H and 202L. Thus, a reference current's statistical distribution overlaps the corresponding distribution of a cell state, as represented by overlap 203 in FIG. 2B. A full spacing between cell states is available for working read margin 201, resulting in over twice the read margin compared to the approach shown in the sample module 207.

In operation, a comparison where a sampled input current 202H, 202L is near the reference current 212, 222 will produce only a weak swing on the resulting node 211, 221. In contrast, the comparison where the sampled input current 202H, 202L is distant from the reference current 212, 222 will produce a strong swing on the resulting node 211, 221. The stronger output signal 214, 224 of the resulting pair of comparisons is then used as inputs 237, 239 to drive an output transistor where its $\Delta V^2$ relationship on current of the third stage 230 reliably swings the output 234 in the appropriate direction, overpowering the largely undriven output transistor associated with the weak signal of the comparison result pair.

The much larger read margin 201, provided by the example devices and methods described herein, allows for significant variation of the sneak current in a crosspoint (or similar corrupting currents), avoiding a need to sample and subtract such corrupting/sneak currents in an effort to recover a read margin (and avoiding a need for consequent increases in circuitry, switching, and timing complications/resources).

Figure 3A:
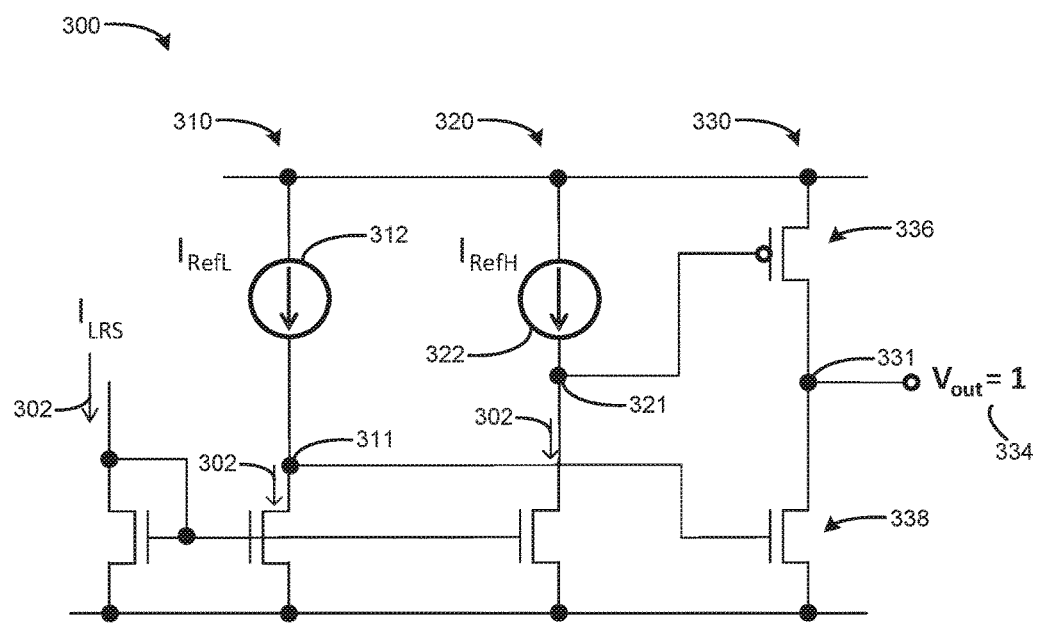
FIG. 3A is a circuit diagram of a device including modules receiving a low resistance state input current according to an example.

FIG. 3A is a circuit diagram of a device 300 including modules 310, 320, and 330 receiving a low resistance state input current 302 according to an example. The first module 310 includes first node 311 and first reference current 312, which is compared to the input current 302. The first node 311 is coupled to an input of the second switch element 338 of the third module 330. The second module 320 includes second node 321 and second reference current 322, which is compared to the input current 302. The second node 321 is coupled to an input of the first switch element 336 of the third module 330. The third module 330 includes third node 331, which compares the states of the first and second switch elements 336, 338 to provide third output 334 (Vout), shown as a digital 1.

The device 300 is shown sensing a low resistive state, which corresponds to a high sensed input current 302. Of the two comparisons performed by the first module 310 and the second module 320, the high input current 302 causes the node 311 of the first module 310 to be weakly driven. Because the input current 302 is similar to the first reference current 312, the first node 311 is caused to be weakly driven by the small differences between input current 302 and first reference current 312. In contrast, for the second module 320, a sufficient difference exists between the high sensed input current 302, and the low second reference current 322. Thus, the second node 321 is strongly pulled low, providing for a good read margin and strong output from node 321 that is fed to the first switch element 336 of the third module 330. At the third module 330, the first switch element 336 (shown for example as a PFET) is turned on, providing a strong digital 1 out as the third output 334 (Vout=1).

Figure 3B:
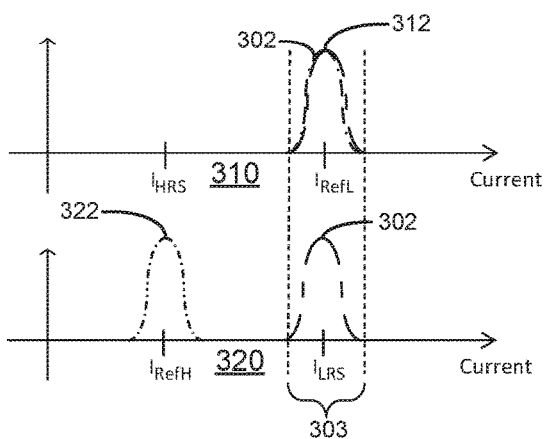
FIG. 3B is a diagram of current probabilities for modules receiving a low resistance state input current according to an example.

FIG. 3B is a diagram of current probabilities for modules 310, 320 receiving a low resistance state input current 302 according to an example. At first module 310, the input current 302 overlaps 303 with first reference current 312, causing a weakly driven node. At second module 320, the input current 302 is spaced apart from the second reference current 322, enabling good read margin.

Figure 4A:
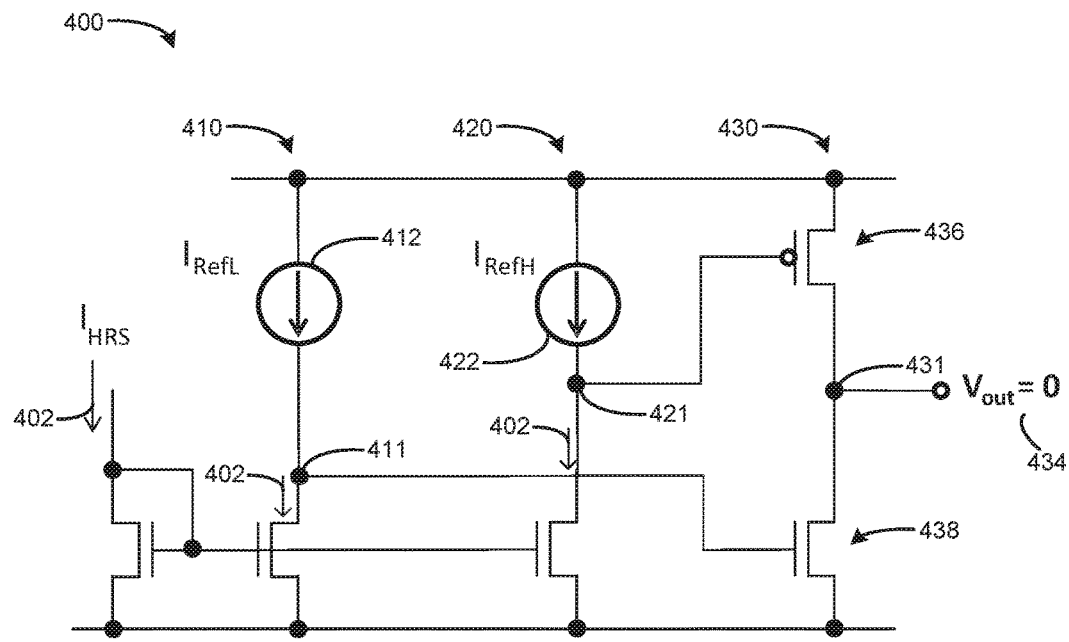
FIG. 4A is a circuit diagram of a device including modules receiving a high resistance state input current according to an example.

FIG. 4A is a circuit diagram of a device 400 including modules 410, 420, and 430 receiving a high resistance state input current 402 according to an example. The first module 410 includes first node 411 and first reference current 412, which is compared to the input current 402. The first node 411 is coupled to an input of the second switch element 438 of the third module 430. The second module 420 includes second node 421 and second reference current 422, which is compared to the input current 402. The second node 421 is coupled to an input of the first switch element 436 of the third module 430. The third module 430 includes third node 431, which compares the states of the first and second switch elements 436, 438 to provide third output 434, shown as a digital 0.

The input current 402 corresponds to a high resistive state of an element to be sensed by device 400. Accordingly, the comparison on the left, performed by first module 410, will be strongly driven. At the first node 411, the reference current 412 is stronger than the sensed input current 402 at the first node 411, which will strongly pull first node 411 high, while providing a good read margin. In the comparison on the right, at the second module 420, the second reference current 422 and the sense input current 402 are roughly the same at the second node 421. Thus, second node 421 is weakly driven by the small/zero differences between currents. At the third module 430, the last stage is hardly driven at all, and the second switch element 438 (shown for example as an NFET) is turned on fairly strongly by the output from the first node 411, providing a good clean digital Vout of 0 as the third output 434.

Figure 4B:
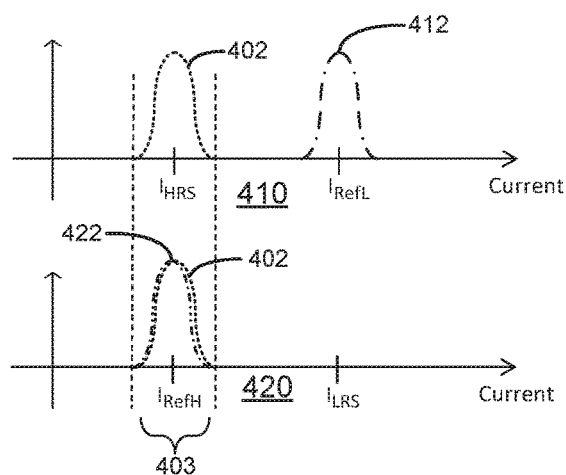
FIG. 4B is a diagram of current probabilities for modules receiving a high resistance state input current according to an example.

FIG. 4B is a diagram of current probabilities for modules 410, 420 receiving a high resistance state input current 402 according to an example. At first module 410, the input current 402 is spaced apart from the first reference current 412, providing a good read margin. At second module 420, the input current 402 overlaps 403 with second reference current 422, resulting in a weakly driven node.

Figure 5:
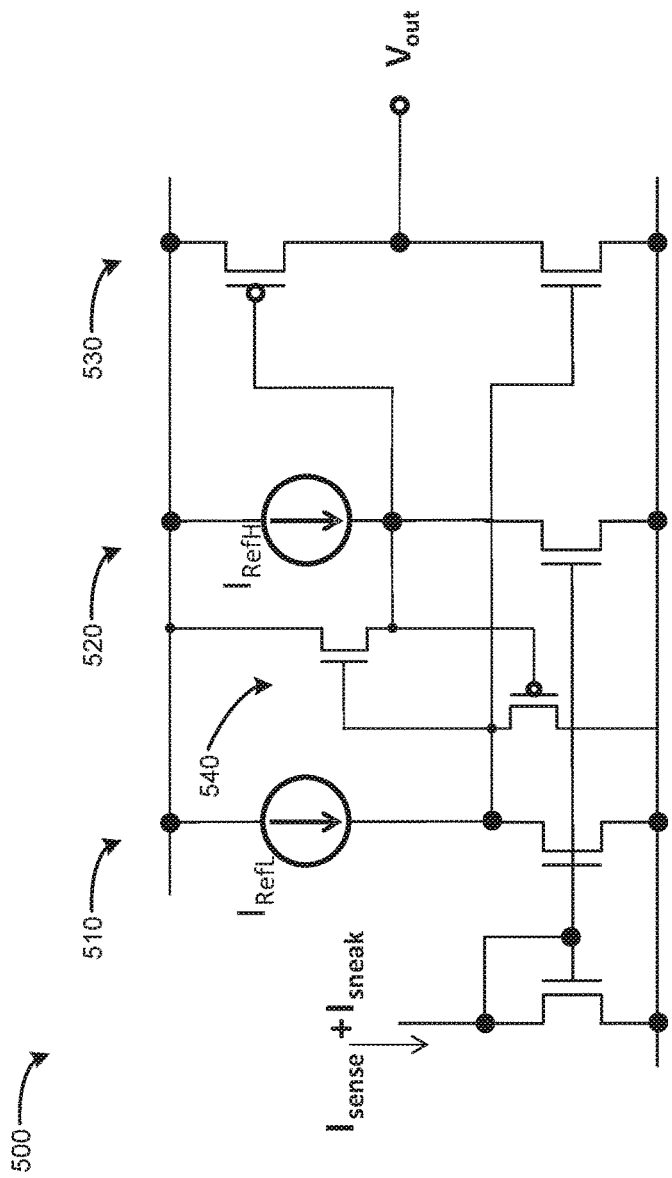
FIG. 5 is a circuit diagram of a device including modules according to an example.

FIG. 5 is a circuit diagram of a device including modules 510, 520, 530, and 540 according to an example. The first module 510, the second module 520, and the third module 530 are similar in arrangement and operation to earlier examples. The fourth module is a feedback module 540. Feedback module 540 is to aid the one of the first/second nodes that is non-weakly driven, and suppress unwanted signals from the other weakly-driven node, speeding the sensing operation performed by the device 500.

The feedback module 540 may be based on a cross-coupled pair of switches, to provide a type of hysteresis in the operational behavior of device 500. If the PFET of the third module 530 is turned on as a result of the comparison at the second module 520 being non-weakly driven, the feedback module 540 is to assist in dragging down/low the input to the NFET of the third module 530. If the NFET of the third module 530 is turned on as a result of the comparison at the second module 520 being non-weakly driven, the feedback module 540 is to influence the third module 530 by causing a gate of the PFET of the third module 530 to be pulled high, contributing to further turning off the PFET in the third module 530. Thus, the feedback module 540 provides hysteresis to the device 500.

Figure 6:
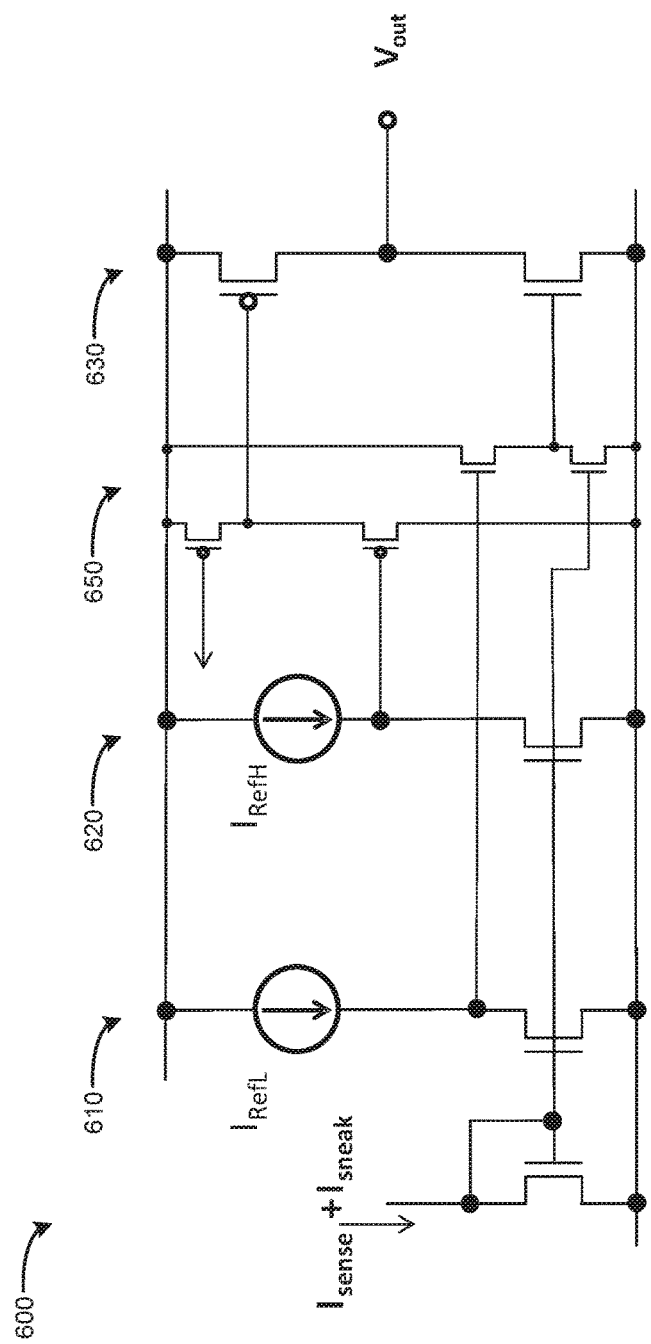
FIG. 6 is a circuit diagram of a device including modules according to an example.

FIG. 6 is a circuit diagram of a device including modules 610, 620, 630, and 650 according to an example. The first module 610, the second module 620, and the third module 630 are similar in arrangement and operation to earlier examples. The sixth module is a level shifter module 650. A gate of the upper PFET of the level shifter module 650 (illustrated by an arrow) may be tied to whichever PFET reference gate is convenient for a given circuit layout/design used for device 600. Further, a load (such as a diode) may be added to the level shifter module 650 to drop voltages, if desired.

The level shifter module 650 may contribute to the relevant input signal of a switch that is not turning off, to assist in its turning off. Also, if there is tolerance in the read margin, the reference current(s) may be moved in order to lower the respective read margin.

The level shifter module 650 may shift the point at which the output turns on one or more FETs, in the first, second, or third modules 610, 620, 630. If, e.g., a read margin is very low, the level shifter module 650 can help a module turn on, by helping with voltage threshold issues. For example, the two lower NFETs in the level shifter module 650 may work together to lower the voltage going to the corresponding NFET of the third module 630, by approximately a threshold voltage. Similarly, the pair of PFETs toward an upper portion of the level shifter module 650 may perform a similar function to the voltage for the PFET of the third module 630.

FIGS. 7A-7C are a circuit diagram of a device 700 including modules 710, 720, 760A1, 760A2, 760B, and 760C according to an example. Device 700 illustrates an example of an N-bit case, where additional components are added to provide additional bits/states to be determined, expanding the concepts described herein to multi-level sensing. More specifically, a 2-bit multi-level cell (MLC) sense amp is illustrated. In FIG. 7A, input current 702 is received, e.g., as a sense current and/or sneak current from an element whose state is to be determined. First module 710 is to compare the input current 702 to $I_{Ref0}$ and provide output A. Second module 720 is to compare the input current 702 to $I_{Ref1}$ and provide output B. Additional module 760A1 is to compare the input current 702 to $I_{Ref2}$ and provide output C. Additional module 760A2 is to compare the input current 702 to $I_{Ref3}$ and provide output D. The outputs A, B, C, and D are provided to additional module 760B of FIG. 7B and additional module 760C of FIG. 7C.

Node A may either go strongly low, or is weakly driven, but does not go strongly high, based on the input current 702 and IRef0 experienced by node A. Nodes B and C may either go strongly high, strongly low, or can be weakly driven, based on the input current 702 and IRef1 or IRef2 experienced by nodes B and C. Node D may either go strongly high, or is weakly driven, but does not go strongly low, based on the input current 702 and IRef3 experienced by node D.

In FIG. 7B, the additional module 760B is to receive the outputs A, B, C, and D from the circuit in FIG. 7A, and use those outputs as inputs. The additional module 760B is to compare the inputs A, B (which are inverted) to the inputs C, D, and provide the output $V_{MSB}$ that is to be received as an input to the additional module 760C of FIG. 7O.

In FIG. 7O, the additional module 760O is to receive the outputs A, B, C, and D from the circuit in FIG. 7A, and receive the output $V_{MSB}$ from the circuit in FIG. 7B, and use those outputs as inputs. The additional module 760B is to compare the inputs A, B, C, and $V_{MSB}$ (which are inverted) to the inputs B, C, D, and $V_{MSB}$, and provide the output $V_{LSB}$.

Instead of one bit for two states, the concepts have been generalized to multiple bits per cell. Two bits provide a total of four states. The concepts may be generalized further, to 3 bits and so on. Device 700 may generate a two-bit output, as $V_{MSB}$, $V_{LSB}$, which represents the most significant bit and least significant bit of a state of the device 700 according to the results of the comparisons at nodes A, B, C, and D.

FIG. 7D is a state table corresponding to states 00, 01, 10, and 11 of the device 700 of FIGS. 7A-7C according to an example. The results of the comparisons at the nodes A, B, C, and D are shown for the states 00, 01, 10, and 11. The possible states for a given node may be seen by reading the column of values for that node, according to the states.

FIG. 7E is a diagram of current probabilities for the device of FIGS. 7A-7C according to an example. The four reference currents $I_{Ref0}$, $I_{Ref1}$, $I_{Ref2}$ and $I_{Ref3}$ are shown, overlapping with the corresponding states 00, 01, 10, and 11. The four different reference currents are chosen to correspond to what values would be seen for a sensed input current, for each of the four states for the memory element/cell being sensed. Based on which reference current the input current overlaps, the corresponding node would be weakly driven, and the resulting values of $V_{MSB}$ and $V_{LSB}$ would identify which reference current distribution the input current fell into, indicating a corresponding state of the element being sensed.

For example, consider a cell to be sensed, that is in state two (10 in binary), and is to provide an input current to device 700 that is consistent with the cell being in state two. The device 700 may perform four simultaneous comparisons at nodes A, B, C, and D. The comparison at node A will be strongly low, and the input/reference currents at that node are separated by a substantially large read margin (i.e., two spacings among the group of reference currents). The comparison at node B, between IRef1 and the input current for state 10, is based on the compared currents still being separated by a full spacing between reference currents, enabling a good read margin for a strongly low-driven node. The comparison at node C is between the input current for state 10, and Iref2, which are approximately equal (close together and/or overlapping). Accordingly, node C results in a weakly-driven node. The comparison at node D is between the input current for state 10 and IRef3, corresponding to one spacing between the group of reference currents, resulting in a strongly high node. Thus, the additional modules 760B and 760C can provide a strongly determined output of the state corresponding to the input current, with a large read margin for each of the states.

In an example, the concepts described herein may be expanded to three bits per cell, in which case there would be eight states, and a corresponding eight comparisons, associated with corresponding additional modules for carrying out the appropriate comparisons. Furthermore, the concepts may be applied to non-binary examples, where a cell might have 3 states, or 5 states, or 6 states, etc. In other words, examples may provide one comparison per state, where the number of states is not a factor of two. Accordingly, examples provided herein are not limited to binary-based multi-level cells (e.g., ternary, quinary, etc.), and may be expanded arbitrarily by adding a corresponding number of modules to carry out the corresponding number of comparisons consistent with the techniques and examples described herein.

Figure 8:
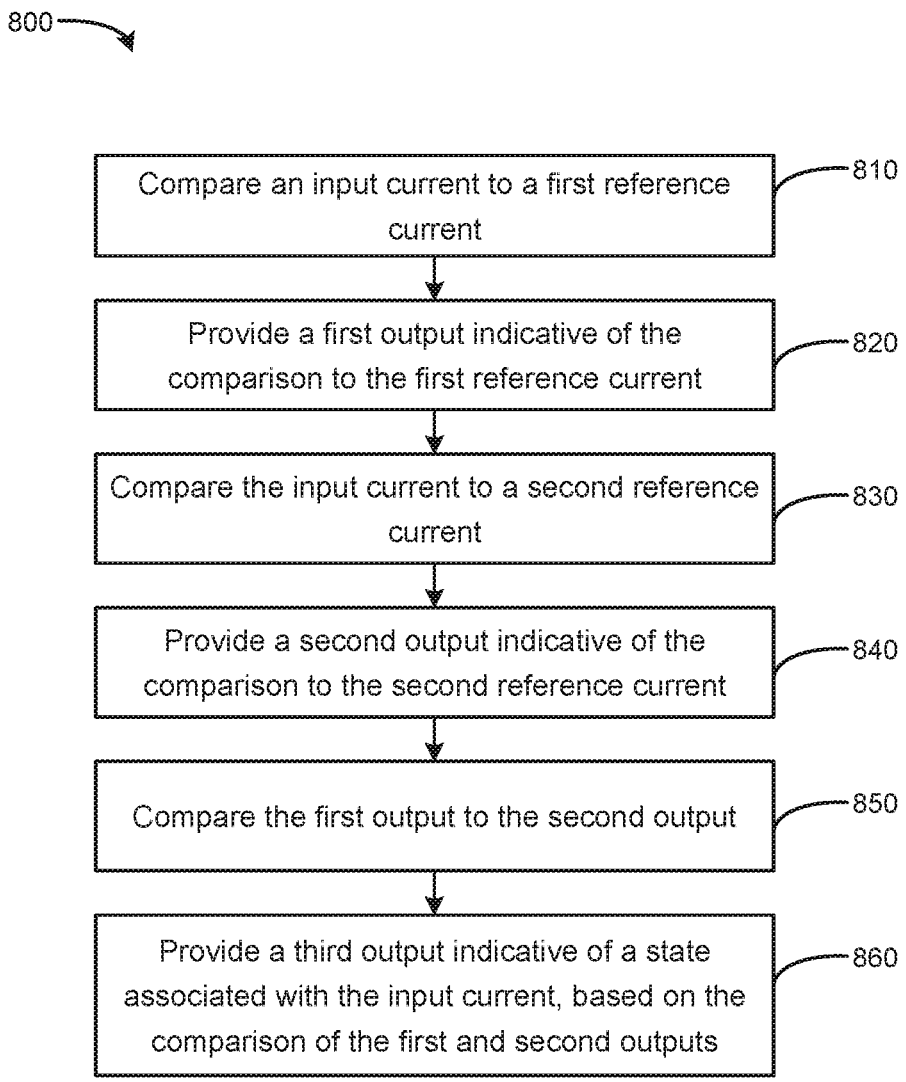
FIG. 8 is a flow chart based on providing an output indicative of a state associated with an input current according to an example.

Referring to FIG. 8, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 8 is a flow chart 800 based on providing an output indicative of a state associated with an input current according to an example. In block 810, an input current is compared to a first reference current. For example, a first node may receive the input current and the first reference current. In block 820, a first output is provided, indicative of the comparison to the first reference current. For example, the first output may be taken from the first node. In block 830, the input current is compared to a second reference current. For example, a second node may be coupled to receive the second reference current, and also receive (e.g., via a current mirror) the input current. In block 840, a second output is provided, indicative of the comparison to the second reference current. For example, the second output may be taken from the second node. In block 850, the first output is compared to the second output. For example, a first switch element may receive the first output, and a second switch element may receive the second output. In block 860, a third output is provided, indicative of a state associated with the input current, based on the comparison of the first and second outputs. For example, the first and second switches may be coupled to each other at a node, from which the third output is taken.

What is claimed is:

1. A device comprising:
a first module to compare an input current to a first reference current, and provide a first output;
a second module to compare the input current to a second reference current, and provide a second output; and
a third module to compare the first output to the second output, and provide a third output indicative of a state associated with the input current, wherein the device is to sense the input current from a two-state cell associated with a first state and a second state, wherein the first reference current corresponds to the first state, and the second reference current corresponds to the second state.

2. The device of claim 1, wherein the device is a current-mode sense amp to sense the input current from a resistive-state memory cell.

3. The device of claim 1, wherein the device is to provide a read margin, associated with reading the input current, corresponding to a spacing between input currents associated with the first state and the second state.

4. The device of claim 1, further comprising at least one additional module to perform at least one additional comparison based on at least one additional reference current, wherein the at least one additional reference current corresponds to at least one additional state and an associated at least one additional read margin.

5. The device of claim 1, wherein the first module and the second module are to compare in parallel.

6. The device of claim 1, further comprising a feedback module to increase comparison speed.

7. The device of claim 1, further comprising at least one level shifter, corresponding to at least one input of the third module.

8. The device of claim 1, wherein the first reference current is associated with a first reference current distribution that is to overlap a device current distribution corresponding to a first device state, and wherein the second reference current is associated with a second reference current distribution that is to overlap the device current distribution corresponding to a second device state.

9. A device comprising:
a first node to receive an input current and a first reference current;
a second node to receive the input current and a second reference current; and
a third node coupled to a first switch element and a second switch element, wherein a first input of the first switch element is coupled to the first node, wherein a second input of the second switch element is coupled to the second node, and wherein the third node is to provide an output indicative of a state associated with the input current.

10. The device of claim 9, wherein the first node is to receive the input current via a first transistor coupled to the first node, and wherein the second node is to receive the input current via a second transistor coupled to the second node.

11. The device of claim 9, wherein the first switch element is a positive-channel field-effect transistor (PFET) and the second switch element is a negative-channel field-effect transistor (NFET).

12. A method comprising:
comparing an input current to a first reference current;
providing a first output indicative of the comparison to the first reference current;
comparing the input current to a second reference current;
providing a second output indicative of the comparison to the second reference current;
comparing the first output to the second output; and
providing a third output indicative of a state associated with the input current, based on the comparison of the first and second outputs.

13. The method of claim 12, further comprising supplying the first reference current corresponding to a first input current associated with a first state of a resistive-state memory cell, and supplying the second reference current corresponding to a second input current associated with a second state of a resistive-state memory cell.

14. The method of claim 13, further comprising supplying at least one additional reference current corresponding to at least one additional input current associated with at least one additional state of a resistive-state memory cell, comparing the input current to the at least one additional reference current, and providing at least one additional output indicative of the comparison to the at least one additional reference current.

15. A device comprising:
- a first module to compare an input current to a first reference current, and provide a first output;
- a second module to compare the input current to a second reference current, and provide a second output;
- a third module to compare the first output to the second output, and provide a third output indicative of a state associated with the input current; and
- at least one additional module to perform at least one additional comparison based on at least one additional reference current, wherein the at least one additional reference current corresponds to at least one additional state and an associated at least one additional read margin.

16. A device comprising:
- a first module to compare an input current to a first reference current, and provide a first output;
- a second module to compare the input current to a second reference current, and provide a second output; and
- a third module to compare the first output to the second output, and provide a third output indicative of a state associated with the input current, wherein the first reference current is associated with a first reference current distribution that is to overlap a device current distribution corresponding to a first device state, and wherein the second reference current is associated with a second reference current distribution that is to overlap the device current distribution corresponding to a second device state.

* * * * *